United States Patent [19]

Götz

[11] Patent Number: 5,445,702
[45] Date of Patent: Aug. 29, 1995

[54] APPARATUS FOR PRODUCING LAMINATE BOARDS

[75] Inventor: Wolfgang Götz, Krefeld-Fischein, Germany

[73] Assignee: G. Siempelkamp GmbH & Co., Krefeld, Germany

[21] Appl. No.: 181,568

[22] Filed: Jan. 14, 1994

Related U.S. Application Data

[63] Continuation-in-part of Ser. No. 774,962, Oct. 9, 1991, abandoned.

[30] Foreign Application Priority Data

Oct. 12, 1990 [DE] Germany ............ 40 32 400.1

[51] Int. Cl.⁶ ............ B32B 31/08; B32B 31/10; B32B 31/20
[52] U.S. Cl. ............ 156/537; 156/324; 156/522; 156/556; 156/563
[58] Field of Search ............ 156/519, 522, 552, 269, 156/307.4, 307.7, 313, 324, 494, 537

[56] References Cited

U.S. PATENT DOCUMENTS

| | | | |
|---|---|---|---|
| 3,441,959 | 4/1969 | Sears | 156/288 |
| 3,499,821 | 3/1970 | Zinbarg | 156/313 |
| 3,870,478 | 3/1975 | Rohlfing | 156/250 |
| 4,356,054 | 10/1982 | Gotz | 156/556 |
| 4,432,828 | 2/1984 | Siempelkamp | 156/556 |
| 4,505,771 | 3/1985 | George | 156/556 |
| 4,510,008 | 4/1985 | Hoshi | 156/324 |
| 4,795,513 | 1/1989 | Jensen | 156/108 |
| 5,057,175 | 10/1991 | Ashton | 156/324 |

Primary Examiner—Michael W. Ball
Assistant Examiner—Daniel J. Stemmer
Attorney, Agent, or Firm—Herbert Dubno

[57] ABSTRACT

A plurality of webs drawn from respective supply rolls forms a core stack which is passed through a single-level press to press boards from the press stack formed by applying cover foils to the core band. Once the pressed board forming part of the band is advanced from the press, the pressed board can be cut and trimmed from the band. The apparatus has a separating web insertion station for selectively inserting a separating web between core forming layers as part of the band so that, when one or more separating layers are inserted, each press cycle simultaneously forms two boards, but when no separating layer is inserted, only a single board is formed at each press cycle and separating operation.

3 Claims, 2 Drawing Sheets

APPARATUS FOR PRODUCING LAMINATE BOARDS

CROSS REFERENCE TO RELATED APPLICATIONS

This application is a continuation in part of Ser. No. 07/774,962 filed 9 Oct. 1991, now abandoned, which claims the benefit of the priority of German application P 40 32 400.1 filed 12 Oct. 1990 under the International Convention.

FIELD OF THE INVENTION

My present invention relates to an apparatus for producing laminate boards of a type in which a cover foil, generally of a synthetic resin material (plastic) or a metal, is bonded to a core, generally composed of a plurality of layers, by heat and pressure. Such boards can be referred to as decor board, since the foil may be a decorative foil and, where the foil is a metal foil, the board may be used industrially in electrical or electronic applications, for example, as printed circuit board. The core can be composed of impregnated fibrous web or sheet material, for example, paper impregnated with melamine resins or nonwoven materials impregnated with thermosetting resins of other types. The core material is generally a kraft paper so impregnated and, when reference is made herein to a kraft paper in the context of the core, it will be understood that I mean to refer to kraft paper impregnated with melamine resins as well as other fibrous layers impregnated with melamine or other thermosetting resins.

The apparatus utilizes a single level or single stage press for producing laminate board and especially decor laminate board having plastic foil or metal foil cover layers on one or both sides of such a core.

BACKGROUND OF THE INVENTION

In the production of laminate board of the aforedescribed type, it has been a common practice to utilize a single stage or single level platen press for effecting the hot pressing of the stack formed by a plurality of kraft paper sheets on which a decor foil layer has been applied to the higher or lower surface to form a stack or packet which is introduced into the press and subjected to hot pressing therein.

Processes for making pressed board in this manner require relatively expensive and complex systems for assembling the sheets into the stack or packet and relatively complex or expensive units for charging the press with the packet and/or removing the packet from the press.

Included in such means, of course, may be means for drawing the kraft paper from the rolls or coils on which the kraft paper is generally supplied and for cutting the kraft paper webs into the sheets which are to be stacked.

It is, however, also known to form decor laminate strip continuously by sandwiching the core layers between foil layers, all of the layers being drawn from respective rolls or coils. Such systems can make use of continuous presses, for example, a double-belt press in which the stacked layers continuously withdrawn from the respective supplies, are guided between a pair of endless steel belts and subjected to pressing between them. A press of this type is comparatively expensive and requires high capital and maintenance cost so that such apparatus is practical only for high production runs. In many cases, the nature of the laminate which is required precludes the use of continuous systems of this type with high production rates.

OBJECT OF THE INVENTION

It is the principal object of the present invention to provide an improved apparatus for producing laminated board having a core formed by a plurality of webs of kraft papers and a decorative foil layer at least on one side thereof which extends the principles of the aforementioned applications.

It is another object of the invention to provide an apparatus for the production of such board, whereby expensive and time-consuming stack assembly steps and apparatus can be avoided, whereby expensive apparatus for charging and emptying single-level or single-stage presses are unnecessary, and whereby the use of a continuous or belt-type press is unnecessary.

Another object of the invention is to provide an improved apparatus for producing laminate board which is of comparatively simple construction and low cost.

SUMMARY OF THE INVENTION

These objects and others which will become more readily apparent hereinafter are attained, in accordance with the present invention, in an apparatus which carries out a method of making laminate board and, particularly, decor laminates as described above, having a core layer and at least one decor layer applied to the core and subjected to pressure and heat in a single level press. This method can comprise the steps of:

(a) displacing a plurality of continuous core-forming flexible webs along a transport path and stacking the webs to form a core;

(b) maintaining a tension along at least a stretch of the path over which the core extends continuously to form a transport band, the tension being sufficient to prevent substantial sag of the band over the stretch;

(c) intermittently advancing the core in a feed direction by a distance determined by a length of laminate boards to be fabricated while maintaining the tension;

(d) applying at a first location along the path of the stretch to at least one of upper and lower surfaces of the core a cover foil having substantially the length of the laminate board to be fabricated and the distance of advance and severed from a continuous foil web by shifting the cover foil onto the core transversely to the feed direction during an interval between advances of the band to form a press stack from the cover foil and the core on the band, whereby the press stack is moved in a subsequent advance to a second location along the path and the stretch downstream of the first location;

(e) during a subsequent interval between advances of the band and, at the second location, hot pressing the press stack in a single-level press to produce a laminated board on the band;

(f) in an advance of the band subsequent to production of the laminated board in the press, carrying the laminated board out of the press in the band; and (g) downstream of the stretch cutting the laminated board from the band.

I have found that it is advantageous to be able to practice this method in an apparatus which selectively permits with each severing operation, one single board, advantageously having the decorative cover foil on both sides thereof, or to two separate boards to be obtained, each with a decorative foil on one surface of the board.

To this end, upstream of the core paper supply cycles, I provide a separating paper insertion station at which at least one web of separating paper is inserted between upper webs and lower webs of the core-forming kraft paper so that the separating paper web or webs forms part of the continuous band upon which the boards are formed.

When the separating paper web is fed between the upper and lower core paper webs, therefore, at each cycle of the single-level platen press, two boards will be formed on opposite sides of the separating paper web so that in the subsequent severing step, instead of a single board being separated from the band, two boards will be separated, one on each side of the separating paper web which, of course, can be discarded so that it does not form part of either board.

It is important for the purposes of this invention to understand that the separating paper supply station or means can be utilized selectively, i.e. may or may not insert the separating paper web or webs between the upper and lower kraft paper core webs.

In the case in which no separating paper web is inserted, of course, a single board is separated from the band with each severing operation. However, when a separating paper web is inserted, two boards are recovered from each separating operation.

The core layer for the or each board is formed from a plurality of layers of a fibrous material impregnated with a thermosetting resin, e.g. kraft papers drawn from respective coils continuously and the core layer forms a band which passes continuously through the stack forming station and the press in which the stack is consolidated by heat and pressure to form the board which remains part of the band until the board is severed therefrom.

Thus the band formed by the continuous core serves (with or without the separating web or webs) as the means for introducing the press packet or stack into the press and for removing it from the press. To form the press packet or stack, the decor foil, severed from a continuous supply, is applied to the upper or lower surface of the core formed by drawing the core layers to be stacked from respective coils in the direction of intermittent advance of the core which can be determined by the cycling cadence of the single level press. The core layers are thus withdrawn at this cadence from the coils and, without subdivision of these layers, form the core stack and are intermittently advanced into and through the press.

The decor layer or layers can be applied in a direction transverse to the feed direction of the kraft paper webs to the stationary core in the intervals between the advance of the webs forming the core, the decor layer or layers being fixed to the coil to form, over the length of the foil applied to the upper and/or lower surface of the core, the press packet.

Generally the decor layer is a foil sheet which is applied at least to the upper surface of the band and usually a corresponding foil sheet is applied to the lower surface of the band.

When a single board is formed at each severing operation, a foil decorative surface area may only be required on one side of the board, in which case the foil applying station need only deposit the foil sheet on one side of the band. However, when decorative surfaces are required on both sides of the board or two boards are to be formed simultaneously at each cycle of the press, because of the insertion of the separating web or webs, decorative foils are provided both on the upper sides and on the lower side of the band in the formation of each stack so that each board will have a decorative layer.

The press packet is fed to the open single level press by the band formed by the kraft paper webs and is pressed in the latter to the decor laminate plates. Each decor laminate plate is transported by the kraft paper webs (and, if provided, the separating paper web or webs) with which the plate remains integral, out of the press by a clamping roller arrangement whose nip engages the core at an upstream end of the stretch. Upstream of the first location and a drawing roller arrangement whose nip engages the band or web downstream of the single level press, a sufficient tension is applied to the stretch so that it remains free from detrimental sag during the transport stages and, of course, during the intervals at which the band or coil is stationary for application of the foils.

The stepping of the core is effected in accordance with the length of the decor laminate boards to be produced.

It will be understood that the foil segments should be fixed to the kraft paper core and this can be done in various ways. For example, I may use a contact adhesive. In its simplest form the attachment of the foil to the core is effected by electrostatic charging of the foil so that the foil will be held by electrostatic forces on the core.

It will be apparent, in the practice of the invention, that the kraft paper webs (and, if provided the separating paper web or webs) fulfill an additional function beyond that of constituting the core material, namely, they simultaneously form a charging band and emptying band or conveyor for the single level press.

The application of the decor foil segment to the upper or lower surface of the band is effected during the stationary or standstill intervals of this band and pressing also can be effected during standstill of the band allowing a simple single-level press to be used.

The cycling time can be comparatively short since the means for introducing the press packet into the press and the removal of the pressed board portion of the band is effected simply and rapidly.

As a result, the apparatus used for producing the pressed board can be of simple construction and can be controlled simply and with ease.

The apparatus can comprise:

a single-level platen press;

a core paper supply station upstream of the press and provided with a plurality of coils of kraft paper adapted to form cores of the boards and feeding respective webs of the kraft paper from the coils along a transport path to the press;

a first set of clamping rolls along the path between the core paper supply station and the press for engaging all of the webs and pressing the webs together to form a band extending continuously from the first set of clamping rolls through the press;

a cover foil applying station along the path between the first set of clamping rolls and the press for applying to at least one surface of the band a decorative cover foil sheet adapted to form a facing layer of a board fabricated in the apparatus, whereby successive boards with the decorative cover sheets thereon are formed along the band with the webs of the band constituting cores of the boards and the boards being interconnected by, supported by and entrained as parts of the band;

a second set of clamping rolls downstream of the press engaging the band with the boards formed as parts thereof for generating a tension in the band and advancing the band through the press;

trimming and cutting means downstream of the second set of clamping rolls for trimming the boards and severing the boards transversely from the band to recover a succession of separate boards individually from the band with the kraft paper webs forming the cores of the boards and the decorative cover foil sheets forming facing layers of the boards; and at least one separating paper supply station upstream of the core paper supply station for selectively feeding into the band between upper webs of the kraft paper and lower webs of the kraft paper at least one separating paper web synchronously with the feed of the kraft paper webs into the band and under the tension so that the at least one separating paper web contributes to support and displacement of the band and two boards are formed simultaneously on opposite sides of the separating paper web at each cycle of the press, the two boards formed simultaneously at each cycle of the press being separated at the separating paper web upon severing of the boards from the band when the separating paper web is disposed between the upper and lower webs, a single board being separated at each severing of the band when no separating paper web is interposed between the upper and lower webs.

The separating paper web or webs can be webs of paper impregnated with silicone to which the kraft paper resin impregnated webs do not adhere or webs of a polytetrafluoroethylene foil or other material to which the kraft paper webs are not adherent.

The foil can be applied in a direction transverse to the transport or feed direction of the band as foil sections cut from a continuous foil supply.

BRIEF DESCRIPTION OF THE DRAWING

The above objects, features and advantages of my invention will become more readily apparent from the following description, reference being made to the accompanying drawing in which.

SPECIFIC DESCRIPTION

Figure 1:
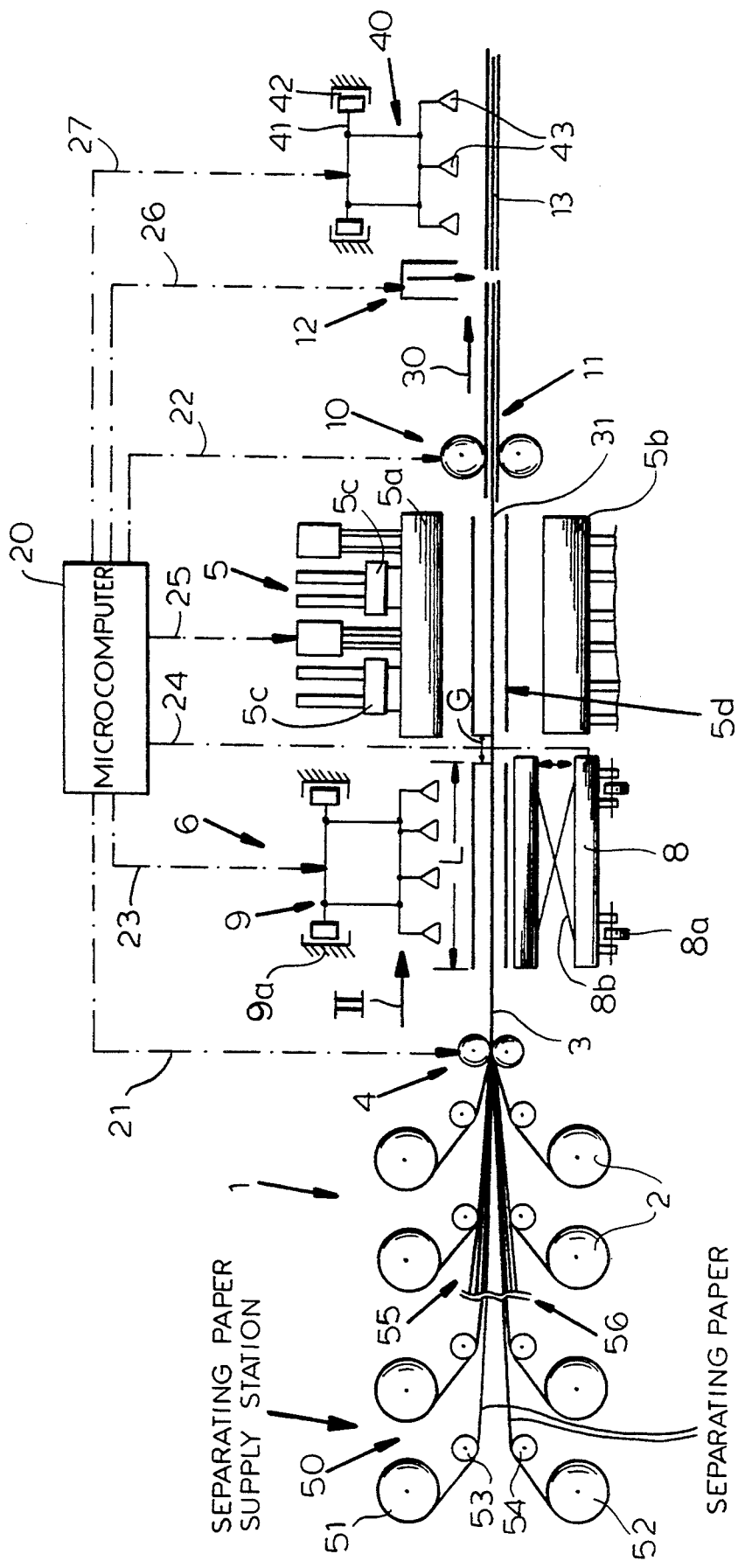
FIG. 1 is a side-elevational view in highly diagrammatic form of an apparatus for producing decor laminate board according to the invention.

The apparatus shown in the drawing can produce decor laminate boards with a core layer and at least one decor layer using heat and pressure to form the laminate.

The apparatus commercials a supply station 1 for supplying the core paper webs from a plurality of coils or rolls 2 of these webs. The core paper webs 3 drawn from the respective coils are stacked to form a core as they pass through a common clamping roll unit 4 which advances the core web 3 in the feed direction represented by the arrow 30 (FIG. 1) while applying a drag to the core so that it is prevented from sagging to any significant extent.

At the other end of the tensioned stretch 31, is a pair of rollers 10 through the nip of which the band is advanced in a stepwise or intermittent manner while maintaining the tension on this band.

Spaced from the pair of rollers 4 and upstream of the rollers 10 is a single-level platen press 5, the platens of which can be seen at 5a and 5b in FIG. 1 and which are heated.

Hydraulic units 5c serve to apply pressure to a stack or packet 5d positioned within the press.

Between the clamping roll unit 4 and the single level platen press 5, a foil delivery station 6 is provided at which decor foils of plastic or metal as represented at 7 can be applied to the upper surface and/or the underside of the core 3.

Figure 2:
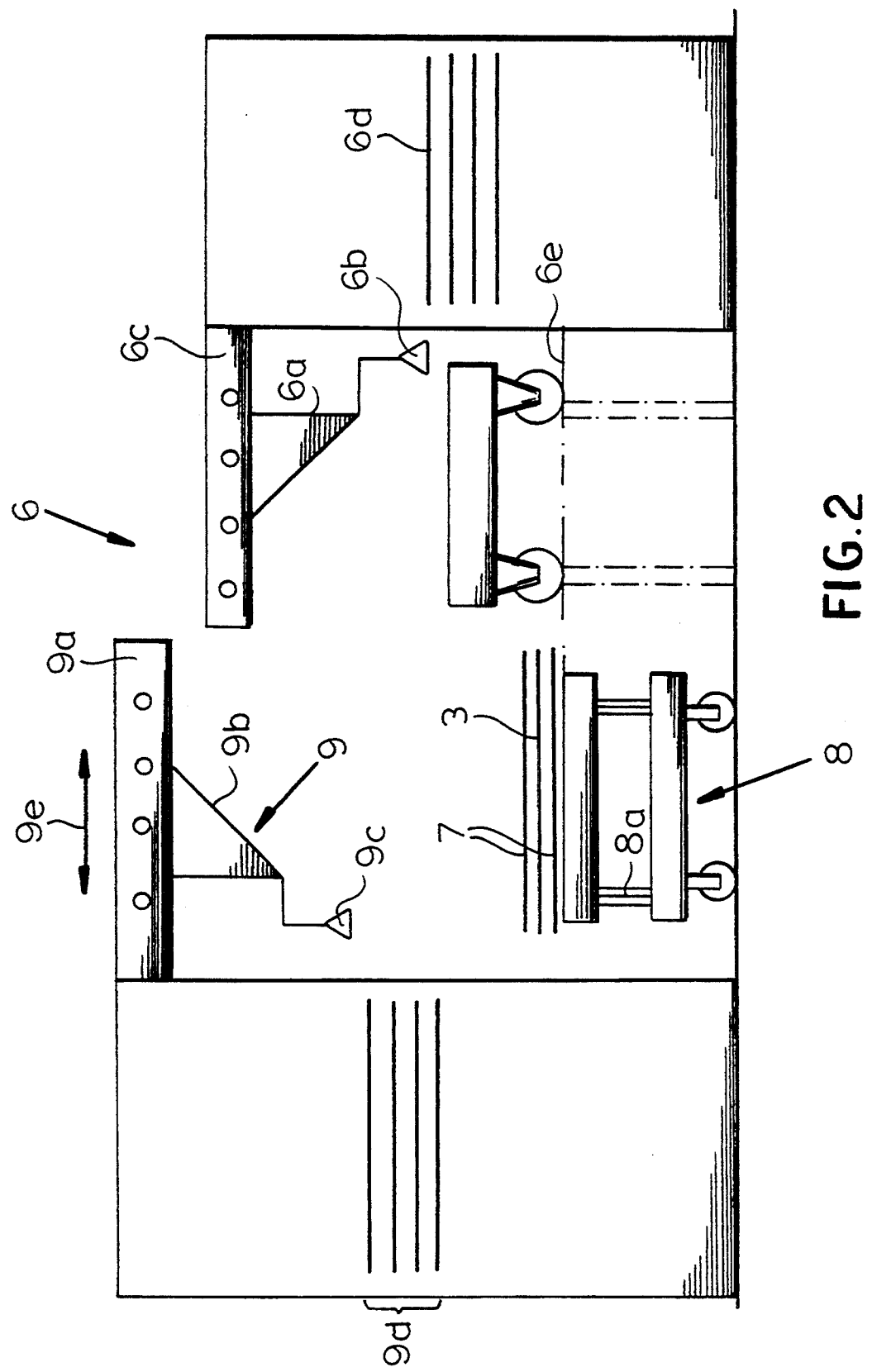
FIG. 2 is a diagrammatic view in the direction of arrow II of FIG. 1.

For this purpose, a vertically shiftable stage or platform 8 and a foil delivery unit 9 are provided below and above the core 3, respectively, these units being described in greater detail in connection with FIG. 2 and being shiftable, as is apparent from the guides 9a and the rollers 8a of the suction unit 9 and the stage 8, in a direction perpendicular to the plane of the paper in FIG. 1, i.e. horizontally and transverse to the feed direction 30.

The foil 7 can be given an electrostatic charge so that it will adhere without additional adhesive means to the upper or lower surfaces of the core 3 and thereby form the press packet 5d. The increment of displacement of the band 31 and the press packet 5d is equal to the length L of the foil segments 7 plus a gap G between successive packets.

Downstream of the clamping rolls 10, at which the decor laminate boards 11 are integral with the band 31, a trimming and separating unit 12 is provided for separating boards 13 from the band 31. The trimmer and cutter 12 can be a saw blade displaceable perpendicular to the plane of the paper in FIG. 1 across the width of the band 31. The boards 13 can be then transported away by a delivery unit 40. The unit 40 may include a carriage 41 displaceable in guides 42 perpendicular to the plane of the paper in FIG. 1 and formed with suction heads 43 which can engage the upper surface of the board 13 and can stack the finished boards as may be desired.

To coordinate the operation of the apparatus, I can provide a microcomputer 20 which can generate the various movements with the proper timing. For example, the microcomputer 20 can control via lines 21 and 22 the roller units 4 and 10, respectively, to advance the band 31 in increments L+G while maintaining the tension, preventing sag previously described and can maintain intervals between the advance of the band 31 sufficient to allow cycling of the press 5 as controlled by the line 25 and application of the foil 7 as represented by the control lines 23 and 24, as well as severing of the finished board via line 26 and the transport of the finished board as controlled by line 27.

As will be apparent from FIG. 1, the stage 8 can be charged by a suction carriage 6a having suction heads 6b and movable in guides 6c transversely to the feed direction 30 with the lower foil from a magazine or supply 6d in which foil segments are stacked after having been cut from a continuous foil supply such as a roll of the foil.

The platform 6e may be raised to lift the stage 8 into position to receive a foil from the supply 6d during advance of the band 31 and, once the foil is applied to the stage 8, the platform 6e can be lowered and the stage 8 shifted to the left (FIG. 2) to a location below the core 3. During the next standstill of the core 3, the platform 8 can be raised by a linkage 8a (FIGS. 1 and 2) to lift the lower foil 7 against the underside of the core 3 while the suction carriage 9b displaceable in the guides 9a has its suction heads 9b withdraw a foil from the supply 9d and deposit it on the core 3 by movement in the horizontal direction of arrow 9e which is transverse to the direction 30.

In operation, therefore, the kraft paper webs forming the core 3 are drawn as endless strips from the coils 2 in the cadence of operation of the single-stage platen press 5 and the decor foils 7 are applied to the core 3 by carrying them transversely onto the core. The resulting press stack 5d is shifted with the band 31 into the open press and the press is closed to hot-press the stack and form the board. The kraft paper webs 3 thus function as a conveyor band for charging and discharging the press.

After the pressed boards, interconnected via the band 31 and the continuous core, is advanced out of the press, the individual boards 13 are separated from the band. The tension applied to the stretch 31 should be sufficient so that there is practically no sag. For these purpose, the rollers 4 can maintain a suitable drag when rollers 10 are driven and both pairs of rollers continuously clampingly engage the band 31.

As described, of course, no separating paper web is inserted between the kraft paper core-forming webs and, upon severing at 12 a single board is formed at each press cycle which may have the decorative foil on one side or on both sides, depending upon the formation of the packet at the foil applying station 6.

In accordance with the present invention, however, a separating paper supply station 50 is provided upstream of the station supplying the kraft paper webs and can have two coils 51 and 52 of siliconized paper which are fed past respective guide rollers 53 and 54 between the paper webs 55 and the lower webs 56 of the kraft paper to prevent the upper webs and lower webs from bonding together when the stacking is subjected to heat and pressure in the press 5. In this case, the decorative foils will be provided on the upper and lower sides of the band so that each of the two boards simultaneously form at each press cycle on opposite sides of the separating webs will have a respective decorative foil layer.

Upon severing of the band at 12, therefore, the separating webs are also cut through and upper and lower boards can be separated from one anther at 40, the separating layers which are thus liberated and usually discarded.

I claim:

1. An apparatus for producing decorative laminated boards, comprising:
    a single-level platen press;
    a core paper supply station upstream of said press and provided with a plurality of coils of kraft paper adapted to form cores of said boards and means for feeding respective webs of the kraft paper from said coils along a transport path to said press;
    a first set of clamping rolls along said path between said core paper supply station and said press for engaging all of said webs and pressing said webs together to form a band extending continuously from said first set of clamping rolls through said press;
    a cover foil applying station along said path between said first set of clamping rolls and said press for applying to at least one surface of said band a decorative cover foil sheet adapted to form a facing layer of a board fabricated in the apparatus, whereby successive boards with said decorative cover sheets thereon are formed along said band with the webs of the band constituting cores of said boards and said boards being interconnected by, supported by and entrained as parts of said band;
    a second set of clamping rolls downstream of said press engaging said band with said boards formed as parts thereof for generating a tension in said band and advancing said band through said press;
    cutting means downstream of said second set of clamping rolls for trimming said boards and severing said boards transversely from said band to recover a succession of separate boards individually from said band with said kraft paper webs forming the cores of said boards and said decorative cover foil sheets forming facing layers of said boards;
    at least one separating paper supply station, including a supply of separating paper, upstream of said core paper supply station and separate from said core paper supply station for selectively feeding into said band between upper webs of said kraft paper and lower webs of said kraft paper from said separating paper supply at least one separating paper web synchronously with the feed of said kraft paper webs into said band and under said tension so that said at least one separating paper web contributes to support and displacement of said band and two boards are formed simultaneously on opposite sides of said separating paper web at each cycle of said press; and
    a station downstream of said cutting means for separating the two boards formed simultaneously at each cycle of said press said separating paper web upon severing of said boards from said band when said separating paper web is disposed between said upper and lower webs, a single board being separated at each severing of the band when no separating paper web is interposed between said upper and lower webs, said cover foil applying station being provided with means for applying said decorative cover sheets to upper and lower surfaces of said band, including at least one carriage displaceable transversely to said transport path for withdrawing decorative cover sheets from a magazine and depositing said cover sheets on said band.

2. The apparatus defined in claim 1 wherein said separating paper supply station includes coils for feeding at least two separating paper webs between said upper and lower webs of the kraft paper.

3. The apparatus defined in claim 1 wherein said cover foil applying station is provided with at least one platform disposed beneath said band and receiving decorative cover sheet for application to an underside of said band.

* * * * *